United States Patent [19]
Voorhes et al.

[11] Patent Number: 5,390,734
[45] Date of Patent: Feb. 21, 1995

[54] HEAT SINK

[75] Inventors: David W. Voorhes, Winchester; Richard D. Goldman, Stoughton; Robert R. Lopez, Boxford, all of Mass.

[73] Assignee: Lytron Incorporated, Woburn, Mass.

[21] Appl. No.: 70,088

[22] Filed: May 28, 1993

[51] Int. Cl.⁶ .............................................. F28F 7/00
[52] U.S. Cl. .................................. 165/185; 165/80.3; 361/704
[58] Field of Search ............................. 165/185, 80.3; 174/16.3; 361/690, 699, 704

[56] References Cited

U.S. PATENT DOCUMENTS

| | | | |
|---|---|---|---|
| 4,139,859 | 2/1979 | Lewis et al. | 357/72 |
| 4,396,936 | 8/1983 | Melver et al. | 357/81 |
| 4,485,429 | 11/1984 | Mittal | 361/386 |
| 4,603,731 | 8/1986 | Olsen | 165/41 |
| 4,867,235 | 9/1989 | Grapes et al. | 165/185 |
| 4,878,152 | 10/1989 | Sauzade et al. | 361/386 |
| 4,922,083 | 5/1990 | Springs et al. | 219/549 |
| 4,938,279 | 7/1990 | Betker | 165/46 |
| 4,999,741 | 3/1991 | Tyler | 361/387 |
| 5,077,637 | 12/1991 | Martorana et al. | 361/386 |
| 5,111,359 | 5/1992 | Montesano | 361/388 |
| 5,195,576 | 3/1993 | Hatada et al. | 165/185 X |
| 5,299,090 | 3/1994 | Brady et al. | 361/703 |

FOREIGN PATENT DOCUMENTS

| | | |
|---|---|---|
| 0009978 | 4/1980 | European Pat. Off. |
| 61-74356 | 4/1986 | Japan . |
| 1163126 | of 0000 | U.S.S.R. ............... 165/185 |

*Primary Examiner*—Stephen M. Hepperle
*Attorney, Agent, or Firm*—Weingarten, Schurgin, Gagnebin & Hayes

[57] ABSTRACT

A heat sink is provided having a bundle of thermally conductive fibers that extend from a heat receiving end to a heat dissipating end where they are splayed as extremely numerous fins of one or plural coalesced fibers to enlarge the effective heat convecting area. The splayed fins are supported or maintained in a splayed array by a structure. Heat dissipation capability is augmented by forcing a cooling fluid such as air through the splayed fins. The fins are initially caused to separate or splay by various techniques including electrostatic spreading, layering, tape rolling, selective coating removal, and elastic rebound, and are maintained in the splayed position by a frame, adhesion, or elastomers.

23 Claims, 10 Drawing Sheets

HEAT SINK

FIELD OF THE INVENTION

The present invention relates to heat sinks, and more particularly to splayed fiber fins acting as a heat sink through an enlarged heat dissipating surface formed by the splayed fins and methods for making the same.

BACKGROUND OF THE INVENTION

As each successive generation of semi-conductor devices, such as microprocessor chips, becomes smaller than the preceding generation of chips, they become increasingly intricate. To accommodate the ever expanding number of chip components, typically transistors, on the ever shrinking chip space, the transistors have become submicroscopic in size and of very high densities. The high density means greater heat generated in a smaller volume with resulting temperature increases. The transistors and other semiconductor components are vulnerable to the heat they themselves produce.

Whereas the heat generated by older generation chips could adequately be dissipated through convection into the static air mass surrounding the chip, or a circulating air mass, their progeny generate significantly more heat, and the heat dissipation requirement is more problematic. Currently, state of the art chips dissipate as much as 30 watts. The next generation of chips is expected to be at power levels which cannot be adequately cooled by conventional structures, such as extruded aluminum heat sinks or fans.

Designers of work stations and PC's are extremely reluctant to provide active cooling means, such as the forced circulation of a cold fluid, because of the cost, reliability and noise associated with them. With respect to compact lap-top computers, the adverse impact on battery life that forced cooling would impose is an additional limitation.

An inexpensive, quiet, reliable and energy efficient alternative to the motor driven fan is a heat sink, which draws heat away from the chip by conduction and provides a supplemental heat convecting surface. Traditional heat sinks such as extruded aluminum finned radiators, however, convect to the internal environment where there is already heated air. Also limited dissipation surface area is provided. It would therefore be advantageous to retain the benefits of a heat sink, while increasing convective surface area, yet decreasing space requirements in the vicinity of a heat producing device such as a chip. It would also be advantageous to place the dissipation surface area at a remote location from the chip.

SUMMARY OF THE INVENTION

The heat sink of the present invention overcomes the inadequacies of prior art heat sinks by greatly increasing surface area for dissipating heat using a fiber bundle conducting heat from a surface to be cooled to a splayed end formed as a multiplicity of fins, each having one or plural coalesced fibers, placed in a natural or a forced cooling fluid environment. Because hundreds of thousands of fibers can be bunched in a single fiber bundle, the number of fins in a splayed end can also be hundreds of thousands, vastly increasing the heat dissipating area compared to other structures, such as conventionally extruded aluminum heat sinks.

The fins are placed in a splayed condition by various separating techniques including electrostatic spreading, layering, tape rolling, selective coating removal, elastic rebound, and ribbon layup. They are maintained splayed by frames, adhesives, or elastomers that position and separate the individual fins, as well as provide structural support and protection to the delicate fibers making up the fins.

A forced air source, such as a fan, can be incorporated adjacent the splayed fin structure, or an aperture may allow air flow from existing chassis fans to pass over the splayed fins. Alternatively, the splayed fin structure can be immersed in a cooling liquid.

The fiber bundle prior to splaying is flexible and thus makes it possible to bend the heat sink bundles around electronic packaging obstructions such as electronic components, circuit boards, hard drives, and power supplies. This fiber bundle flexibility accommodates component cooling in tightly confined electronic packages.

To improve the cooling performance of this heat sink, the length of fiber bundle between heat source and splayed fins can be reduced or eliminated. Additionally, the transverse thermal conductivity of the fibers can be improved by impregnating them with a more thermally conductive material, by interleaving the fibers with metallic strips or films, or by compression that eliminates insulating air pockets.

DESCRIPTION OF THE DRAWINGS

The invention will be more fully understood from the following detailed description, taken in conjunction with the accompanying drawings in which:

FIG. 7a illustrates a manufacturing step for making the heat sink of FIG. 1a;

FIG. 7b illustrates a manufacturing step subsequent to that illustrated in FIG. 7a;

FIG. 8a illustrates a first step of an alternative manufacturing process for making the heat sink of FIG. 1a;

FIG. 14a is a simplified diagram of an assembly line for manufacturing the heat sink of FIG. 13a; and FIG. 14b illustrates another step in the manufacture of the heat sink of FIG. 13a.

DETAILED DESCRIPTION OF THE INVENTION

Figure 1A:
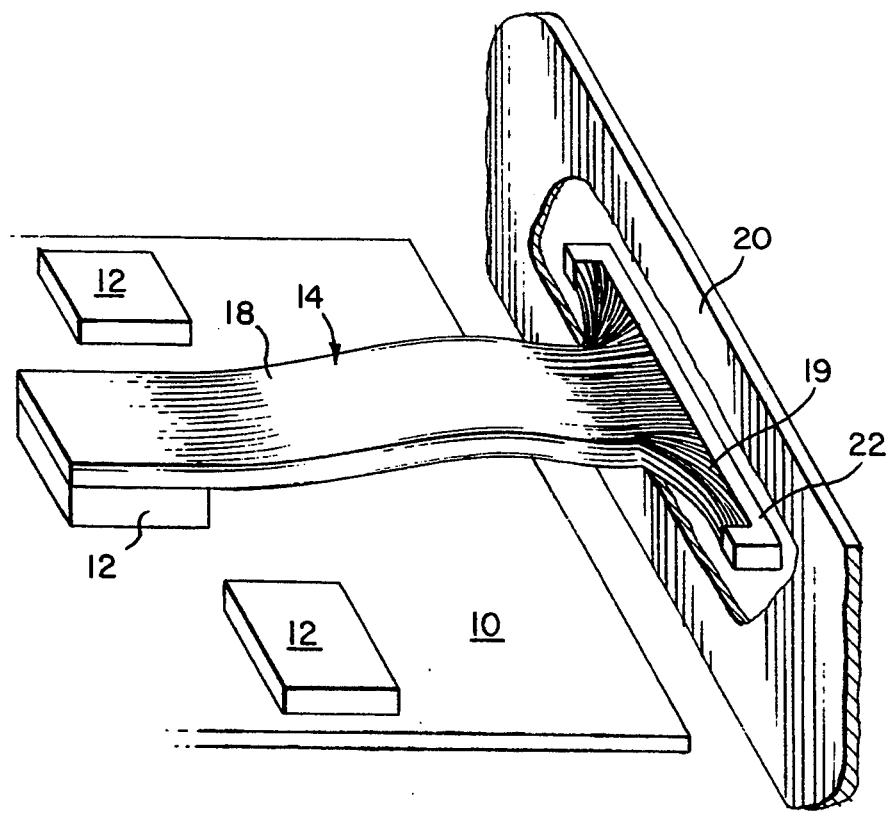
FIG. 1a is perspective view of a heat sink of the invention shown in a configuration for drawing heat from a heat emanating surface to the exterior of a housing for the surface.

FIG. 1a is a highly simplified view of a circuit card 10, such as a motherboard, having numerous heat producing surfaces or devices, such as microprocessor or other chips 12, mounted thereon. A heat sink 14 of the invention is shown in thermally conductive contact with one of the chips 12. The heat sink 14 includes a fiber bundle 16 comprising numerous individual fibers 18 (e.g. thousands) having a portion, such as one end, adapted for thermal contact with the chip 12 and an end portion remote from the chip 12 where numerous fins 19, each consisting of one or more individual fibers 18, are splayed so as to expose to the environment a vast surface area for heat dissipation into a fluid medium in the environment. "Bundle" as used herein is not meant to connote any particular shape for the group of fibers, which may be configured various ways, including cylindrical, oval, linear, or rectangular cross-sections. Additionally, "fin" as used herein encompasses any of a number of shapes, including circular, oval, ribbon like, rectangular, polygonal, or flat sheet cross-sections.

Although the numerous configurations of the heat sink 14 described hereinbelow are especially well suited for transferring away heat from a surface or device, it is important to note that the heat sink 14 is bi-directional, thus allowing a device or surface to be heated from an environmental fluid.

Figure 1B:
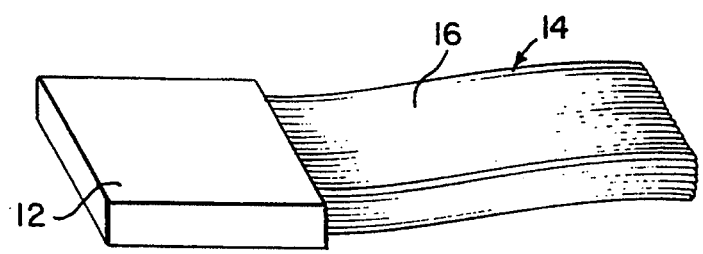
FIG. 1b illustrates an alternative mating configuration for the heat sink of the invention and the heat emanating surface.
Figure 1C:
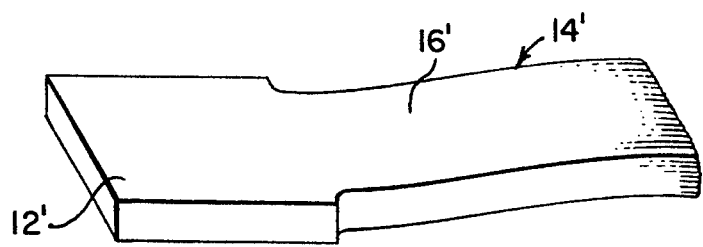
FIG. 1c depicts a heat emanating device having an integral heat sink of the invention.

In order to facilitate either heating or cooling, a portion of the heat sink 14 must be placed sufficiently close to the subject surface that heat transference is possible. Accordingly, in one embodiment, a portion of the bundle 16 is juxtaposed with the heat producing surface by mechanical or other means. In another embodiment, a portion of the bundle 16 is secured to the heat emanating surface with an adhesive or thermally conductive elastomer that does not place mechanical stress on the device being cooled. With respect to positioning the end portion of the bundle 16, it can be located on top of the device, as shown in FIG. 1a, or because certain fibers conduct better axially, it can be positioned edge-on with the device as shown in FIG. 1b to directly expose the ends of the fibers to the device. In yet another embodiment, a portion of a bundle 16' is integrally formed with a device casing. For example, a heat sink 14' can be potted into a chip casing 12' to form a pig-tail as illustrated in FIG. 1c.

The bundle 16 can be configured as a ribbon cable which makes it sufficiently flexible to be easily routed over or around various components. FIG. 1a illustrates the fiber bundle 16 protruding through a portion of a device housing 20, on the exterior side of which the splayed fins 19 are secured to a fin securing and splaying structure 22.

In one embodiment the fibers 18 are pitch graphite fibers, such as P120 or K1100 fibers produced by the Amoco Performance Products, Inc., which have an axial thermal conductivity greater than 500 W/m°K. and a transverse thermal conductivity less than 100 W/m°K. The transverse thermal conductivity of the portion of the fiber bundle 16 which is in contact with the chip 12 can be increased by impregnation with a metallic substance, such as aluminum or copper in the bundle voids. The portion which makes thermal contact with the chip 12 can have its transverse thermal conductivity further increased by tightly compressing the fibers to eliminate insulating interstitial air pockets. When the fibers 18 are in flat sheet form, the transverse thermal conductivity of the portion which makes contact with the chip 12 can be further increased by inserting flat sheets of a more thermally conductive second material, such as copper, between the fibers 18. In alternative embodiments, the fibers are made of aluminum or copper.

In an exemplary embodiment of the heat sink 14, the fiber bundle is in ribbon cable form and has dimensions 2 inches wide by 0.1 inch thick, and the fins (composed of one or more fibers) have a square cross-section of 0.001 inches by 0.001 inches. Thus there are approximately 200,000 fins emanating from the cable in this example. If each fin 19 is approximately one inch in length, the surface area of the fin is approximately 0.004 in$^2$. Therefore the total surface provided by all of the fins is approximately 800 in$^2$. This represents an enormous surface area increase when compared to the surface area of the unsplayed portion of the bundle 16. Thus 200,000 fins 19 splayed to 0.005" centers in a fin securing structure 22, require that the structure 22 be 5 square inches, e.g. a structure 22 that is 10 inches wide and 0.5 inch tall. In the exemplary embodiment, the fibers of the fiber bundle are four to six inches in length, although other lengths are contemplated.

Many configurations and placements of the heat sink 14 having splayed fins are possible to further enhance heat dissipation. To more clearly describe these configurations and positioning considerations, the portion of the heat sink 14 wherein the fins are splayed to enhance heat dissipation is hereinafter referred to as a "heat distributor."

Figure 2:
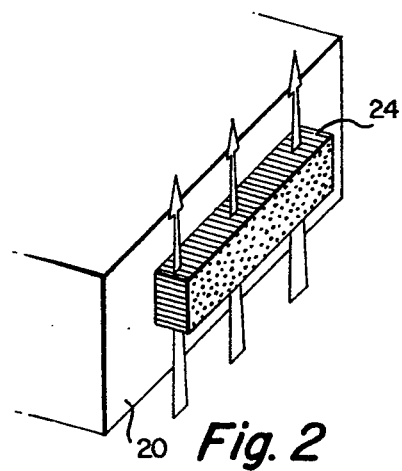
FIG. 2 is a perspective view of the heat distributor of FIG. 1a extending into a free convection air flow.

Referring to FIG. 2, the heat distributor 24 of the heat sink 14 is shown mounted externally to the housing 20 so as to place the heat distributor 24 in the path of a free convection air flow, illustrated by arrows. In this view, the fins are shown to be parallel with each other in the heat distributor 24.

Figure 3:
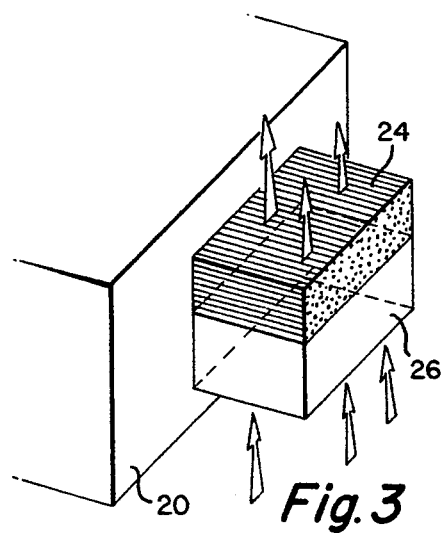
FIG. 3 is a perspective view of the heat distributor of FIG. 1a exposed to a forced air flow.

FIG. 3 illustrates a configuration for an application where incorporation of a fan 26, such as a small muffin fan, is acceptable. The fan provides forced airflow across the heat distributor 24 which may be smaller or more dense than the heat distributor of FIG. 2 because of the augmented airflow. The optimum geometry for the fins in this application is that which maximizes the surface area yet which does not exceed the allowable pressure drop of the fan.

Figure 4:
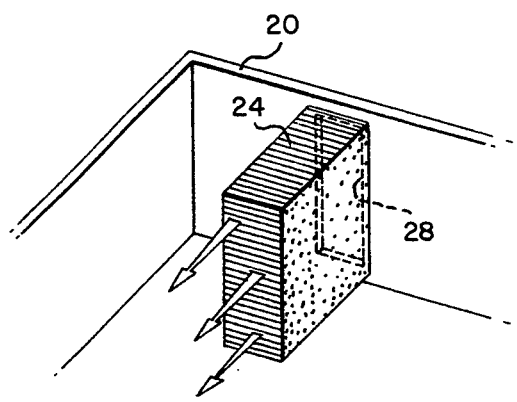
FIG. 4 is a perspective view of the heat distributor of FIG. 1a positioned in the path of air entering an opening in a computer housing.

FIG. 4 illustrates a heat distributor 24 adapted for use in a housing 20, such as for a computer, that already has an internal cooling fan (not shown). The heat distributor 24 is positioned in front of an opening 28, such as the opening for a computer's unused expansion slot, through which air is drawn by the computer's cooling fan.

Figure 5:
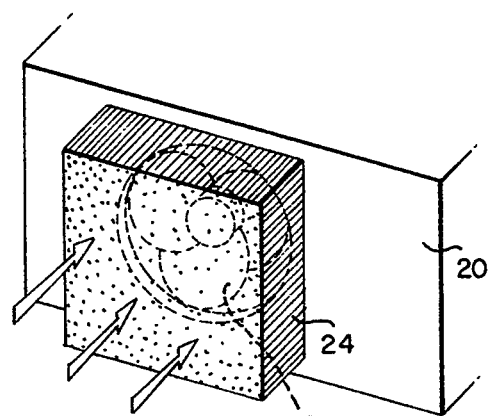
FIG. 5 is a perspective view of the heat distributor located in the path of air exhausted from the interior of a computer housing.

FIG. 5 shows a configuration wherein the heat distributor 24 is placed directly in front of a computer's power supply fan 30.

Figure 6A:
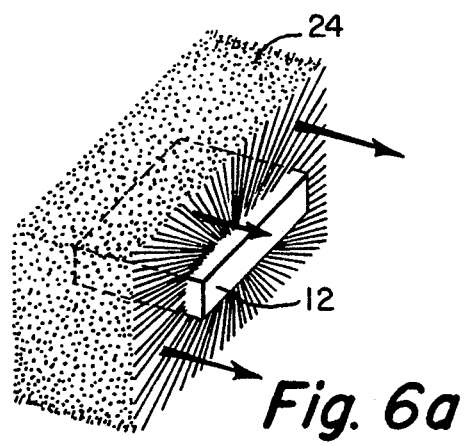
FIG. 6a is a perspective view of a heat distributor located in close proximity to a device to be cooled.

FIG. 6a illustrates an embodiment of a heat distributor 24' formed of splayed fins adapted for placement adjacent a chip 12. This embodiment does not include a ribbon cable thereby eliminating its thermal resistance. Positioning the heat distributor 24' in close proximity to the chip 12 makes effective use of a normal or internally forced airflow around the chip 12.

Figure 6B:
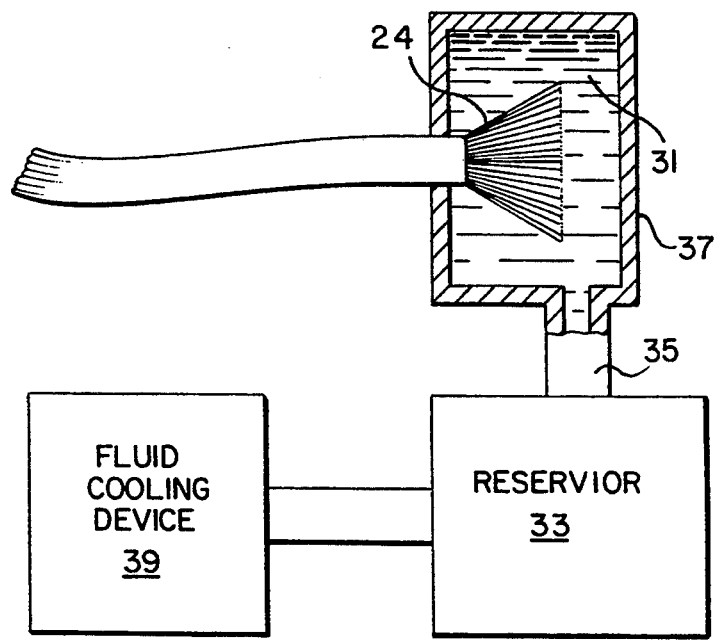
FIG. 6b depicts a heat distributor immersed within a cooling liquid.

To this point, either a static or a moving air mass has been described as the environment into which the splayed fins convect their heat. However, the cooling fluid can also be a liquid 31. FIG. 6b illustrates the use of a liquid 31, such as water, Fluoroinert ™ (product of 3M), hydraulic oil, refrigerants and the like, into which all or a portion of the heat distributor 24 is immersed. In one embodiment, the liquid 31 is circulated from a fluid reservoir 33 through tubing 35 to a heat exchange vessel 37, shown in a cross-sectional view. The fluid can be cooled with a cooling device 39 known to those skilled in the art, such as a condenser, a thermoelectric heat pump, or the like. The greater heat capacity of the cooling liquid 31 and the lower temperatures to which it can be depressed allows the heat sink 14 to cool the heat producing surface to lower temperatures than is possible when the cooling fluid is room temperature air.

Because each of the above exemplary configurations and placements, as well as the power and heat dissipation requirements of particular chips are different, the specific dimensions and spacings of fins in the heat distributor 24, as well as particular fiber characteristics are established quantitatively using the equations hereinebelow. The equations, numbered 1.1 through 1.10 define the thermal performance of the invention in general terms. They are valid regardless of the type of cooling fluid used. These equations are also valid for any fin geometry and fiber material.

A first consideration for configuring a heat sink is the total temperature rise ($\Delta T_{total}$), which consists of two parts: the temperature rise along the length of the cable ($\Delta T_c$), and the temperature rise along the length of the heat distributor ($\Delta T_D$), which may be written as:

$$\Delta T_{total} = \Delta T_c + \Delta T_D \tag{1.1}$$

This can be rewritten as:

$$\Delta T_{total} = \frac{Wl_c}{k_c A_c} + \frac{W}{\dot{m} C_p \epsilon} \tag{1.2}$$

where
 W = power to be dissipated;
 $l_c$ = cable length;
 $k_c$ = cable thermal conductivity;
 $A_c$ = cable cross-sectional area;
 $\dot{m}$ = cooling fluid mass flow rate;
 $C_p$ = cooling fluid specific heat; and
 $\epsilon$ = effectiveness of heat exchange.
Because $$\dot{m} = V \rho l_f D \tag{1.3}$$

where
 V = cooling fluid velocity;
 $\rho$ = cooling fluid density;
 $l_f$ = fin length;
 D = distributor width;
equation (1.2) can be written as:

$$\Delta T_{total} = \frac{Wl_c}{k_c A_c} + \frac{W}{V \rho l_f D C_p \epsilon} . \tag{1.4}$$

Each of these terms except for the effectiveness ($\epsilon$) are easily determined by examination of the invention geometry.

The effectiveness is given by the following equation:

$$\epsilon = 1 - e^{(-N_{TU})}$$

where $N_{TU}$ is the number of thermal units and is determined by the following equation:

$$N_{TU} = \frac{R_f \left( \frac{k_f A_f}{l_f} \right) \eta_f}{\dot{m} C_p} \tag{1.6}$$

where
 $R_f$ = number of fin rows;
 $k_f$ = fin thermal conductivity;
 $A_f$ = fin cross-sectional area; and
 $\eta_f$ = fin efficiency.
Fin efficiency $\eta_f$ is given by the following equation:

$$\eta_f = \frac{\tanh\left(\sqrt{\frac{h p_f}{k_f A_f}} \cdot l_f\right)}{\left(\sqrt{\frac{h p_f}{k_f A_f}} \cdot l_f\right)} \tag{1.7}$$

where p_f = fin perimeter; and h_f = fin heat transfer coefficient.

For the laminar flow regime, $h_f$ is given by the following equation:

$$h_f = .664 \frac{k_f}{l_f} P_r^{\frac{1}{3}} R_{eL}^{\frac{1}{2}} \tag{1.8}$$

where $P_r$ = Prandtl number; and $R_{eL}$ = total surface Reynolds number.

The Prandtl number and the total surface Reynolds number are given by the following equations:

$$P_r = \frac{\mu C_p}{k} \tag{1.9}$$

$$R_{eL} = \frac{V \rho \frac{P_f}{2}}{\mu}$$

where

η = cooling fluid viscosity k = cooling fluid thermal conductivity

In summary, the $\Delta T_{total}$ can be determined if the following variables are known:

Fluid:
- V = velocity;
- ρ = density;
- μ = viscosity;
- k = thermal conductivity; and
- $C_p$ = specific heat.

Fin:
- $p_f$ = perimeter;
- $l_f$ = length;
- $A_f$ = cross-sectional area;
- $k_f$ = thermal conductivity; and
- $R_f$ = number of fin rows.

Cable:
- $l_c$ = length;
- $A_c$ = cross-sectional area; and
- $k_c$ = thermal conductivity.

General:
- D = distributor width; and
- W = power to be dissipated.

Although the exemplary model presumes operation in the laminar flow regime, appropriate substitution of equation 1.8 allows for a non-laminar flow situation. Furthermore, if the ribbon cable part of the heat sink is replaced by a heat pipe for example (where $k_c \approx \infty$) or if its length is eliminated entirely by affixing the splayed part directly to the chip ($l_c = 0$), then the first term in equation 1.2 drops out completely and the performance is improved.

Case 1

$k_c \approx \infty$

Case 2

$l_c \approx 0$

After calculating the particular number of fins 19 and their spacing, in consideration of the performance requirements of the heat sink 14, the heat sink 14 and its heat distributor 24 are manufactured in accordance with one of the following methods. In each of the methods, particular emphasis is placed on techniques for splaying the fins 19 and then fixing their positions relative to each other. In each of these methods it is assumed that the fibers 18 have already been coalesced into individual fins 19 by techniques known to those skilled in the art.

Figure 7A:
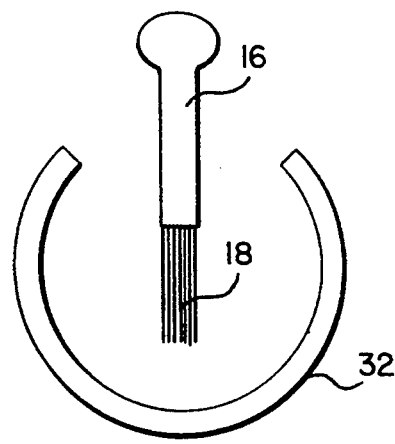

FIG. 7a illustrates a first step of a manufacturing technique that employs static electric charges to splay the fins 19. A portion of the highly electrically conductive fins 19 emanating from the bundle 16 is placed into an opening in a metal sphere 32 to which a charge may be applied.

Figure 7B:
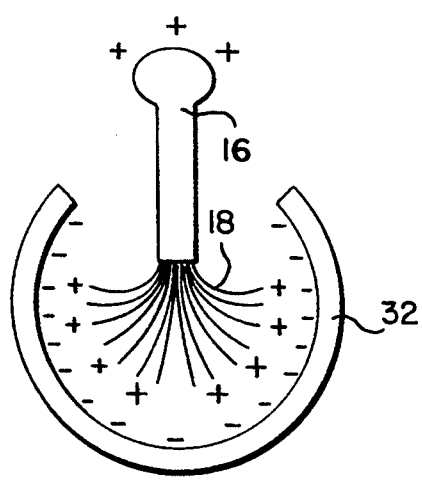

FIG. 7b illustrates the effect of applying a charge to the sphere 32, and an opposite charge to the fins that repels each of the fins from the others equidistantly. The splayed fins are fixed into position by spraying adhesive on them in the stem area where they emerge from the bundle.

Figure 8A:
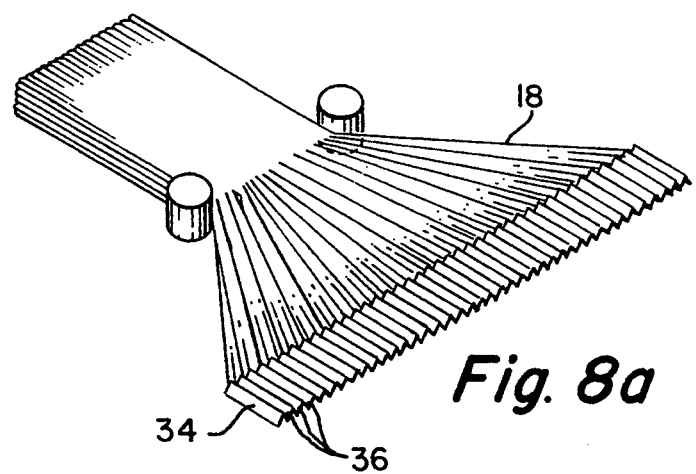
Figure 8B:
FIG. 8b is an end view of a partially fabricated heat sink.

FIG. 8a illustrates another manufacturing technique that includes providing corrugated strips 34 having slots or depressions 36 in accordance with the spacing requirements into which individual fins are introduced. After the depressions 36 in each strip 34 are filled, another strip is placed on top of the first strip and its depressions 36 are filled with fins 19. This process is continued layer after layer, as shown in FIG. 8b, until the desired number of fins 19 are distributed.

Figure 8C:
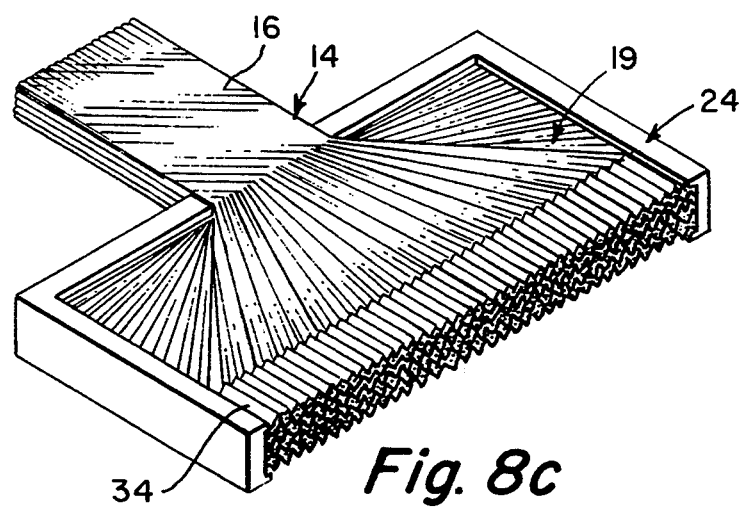
FIG. 8c is a perspective view of completed heat sink.

Referring to FIG. 8c, the fiber bundle 16 of the heat sink 14 is formed by compressing it to a desired dimension and covering it with plastic insulation or shrink wrap to retain it in the desired shape. The splayed portion of the fins 19 encased in the strips 34 forms the heat distributor 24.

Figure 9A:
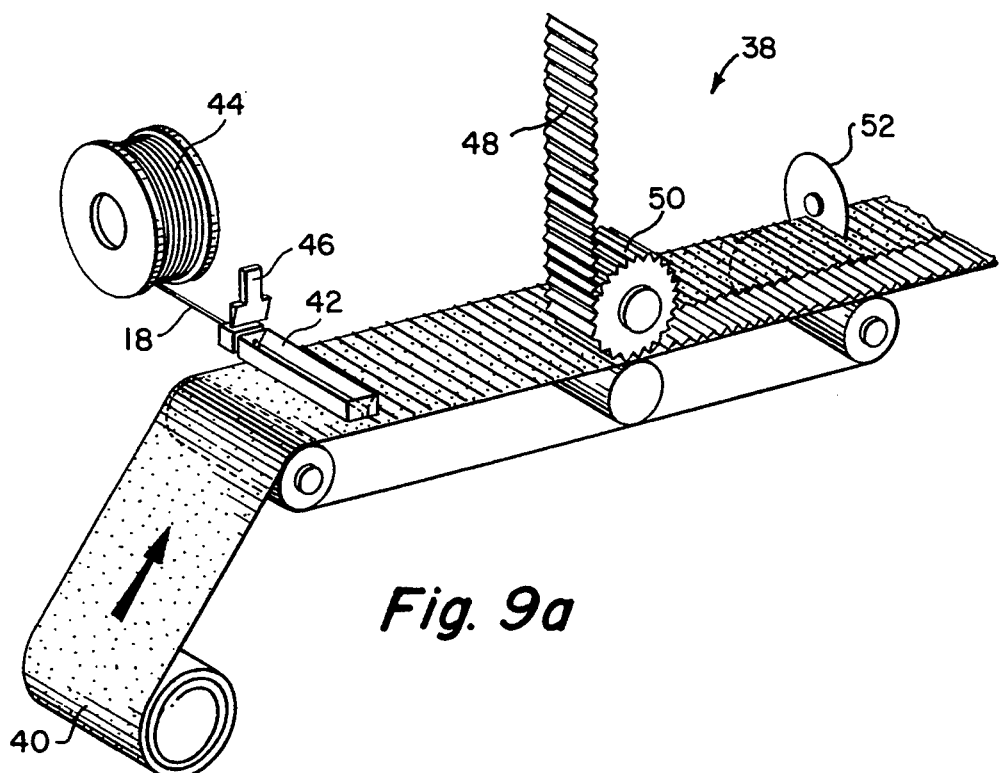
FIG. 9a is a simplified diagram of an assembly line for performing several steps in an alternative manufacturing technique.
Figure 9B:
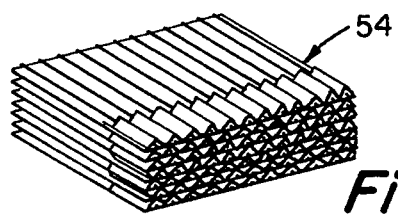
FIG. 9b depicts a stack of sheets produced by the assembly line of FIG. 9b.

Referring now to FIG. 9a an embodiment of an assembly line 38 for producing heat sinks 14 is shown in greatly simplified form. A supply of tacky paper 40 is fed in the direction of the arrow over toward a pneumatic tube which aspirates a fin 19 from a fin supply 44 until a cutting tool, such as a slitter, severs the fin 19 from the fin supply 44. The cut fin 18 is then dropped onto the tacky paper 40 and the tacky paper advances to permit another fin to be dropped thereon. In a subsequent step, a spacing strip 48 of a suitable material is applied along one edge of the tacky paper 40 by a roller. The strip 48 may already be corrugated or the roller 50 can be provided with the appropriate surface texture to make the corrugations which form the depressions into which the fins 19 are positioned. After application of the strip 48, the formed sheet is cut to a desired width by a second cutting tool 52, such as rotary saw, and placed into a stack 54 as shown in FIG. 9b.

Figure 9C:
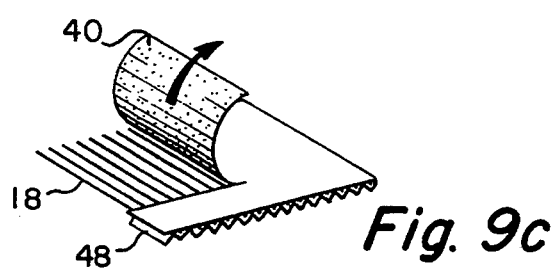
FIG. 9c illustrates an intermediate step in the alternative manufacturing process.

FIG. 9c illustrates a subsequent manufacturing step, wherein the tacky paper 40 not covered by the strip 48 is removed. This is accomplished by flipping the sheets up one at a time and peeling off the tacky paper 40, as shown by the arrow, from the portion of the fins 19 not covered by strip material 48.

Figure 9D:
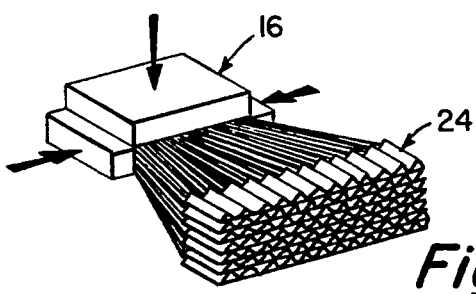
FIG. 9d is a depiction of a portion of the sheets being compressed to produce the ribbon cable portion of the heat sink.

FIG. 9d depicts the uncovered fin portions, with the tacky paper removed, being compressed to define the ribbon cable 16. The fin portions covered with strip material 48 form the heat dissipator 24 having the characteristics described herein above.

Figure 10A:
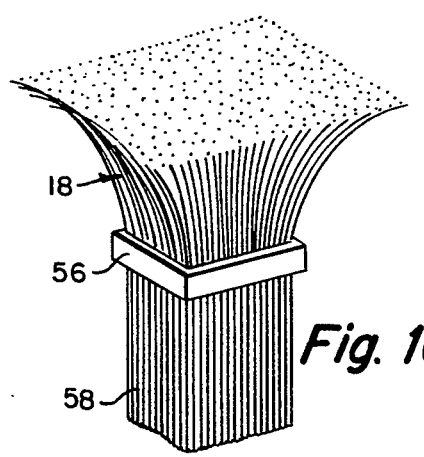
FIG. 10a depicts a beginning step of an alternative manufacturing method that uses gravity to splay the fins in the heat sink of the invention.

FIG. 10a depicts an initial step of an alternative manufacturing method that uses gravity to splay the fins 19. A cinch 56 is placed about an intermediate region of a fiber bundle 58. The fiber bundle 58 is then held upright, wherein the weight of the fins above the cinch 56 causes them to droop varying amounts. The amount of droop is modifiable by moving the cinch 56 up or down the fiber bundle 58.

Figure 10B:
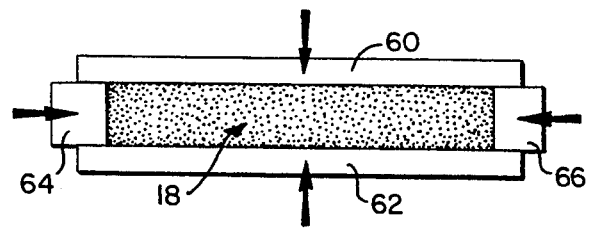
FIG. 10b is a top view of the fins during a fin spacing step.

FIG. 10b is a top view of the gravity splayed fins 19, wherein a first plate 60 and a second plate 62 having the fins 19 therebetween are pushed together until the fins 19 are at a predetermined spacing. Third and fourth plates, 64 and 66 respectively, can be provided for supplemental retention or compression of the fins 19 once the spacing between the first plate 60 and the second plate 62 is established.

Figure 10C:
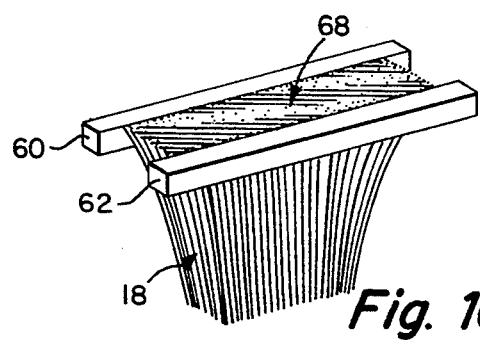
FIG. 10c is a perspective view of the heat sink undergoing a manufacturing step wherein an adhesive is applied to the properly spaced fins to fix their relative positions.

FIG. 10c illustrates a subsequent manufacturing step, wherein an adhesive 68 is applied to the spaced fins between plate 60 and plate 62 to fix their relative positions.

Figure 10D:
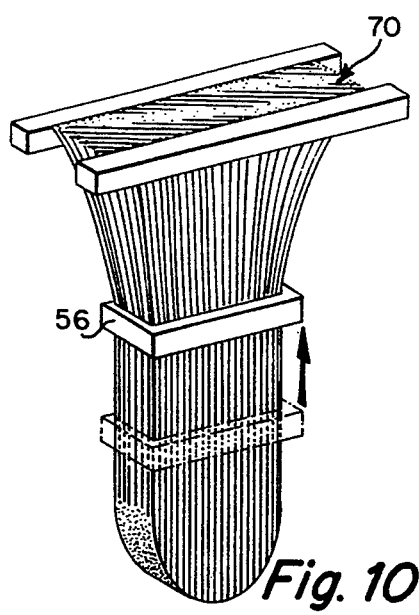
FIG. 10d is a perspective view of the heat sink following trimming and adjustment of a cinch.
Figure 10E:
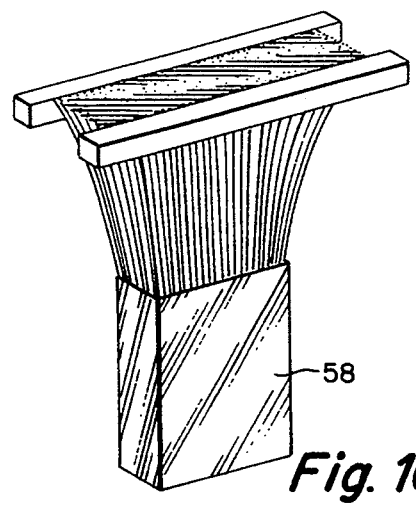
FIG. 10e illustrates the trimmed, cinched, and insulated heat sink at the conclusion of the manufacturing process.

FIG. 10d illustrates adjustment of the cinch 56 toward plate 62 to define a heat distributor 70. In a final step, shown in FIG. 10e, the fiber bundle 58 is trimmed and covered with insulation, and the cinch 56 is removed.

Figure 11A:
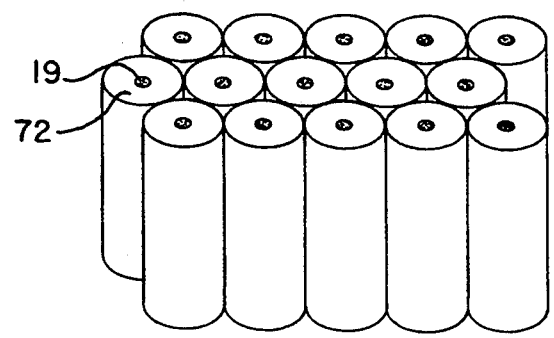
FIG. 11a shows yet another alternative method of achieving proper spacing of the fins using a removable material.

As shown in FIG. 11a, yet another approach for providing proper spacing between the fins 19 is to encapsulate the fins in an easily removable material, such as paraffin, or an etchable coating wherein the coating thickness determines the spacing between the fins.

Figure 11B:
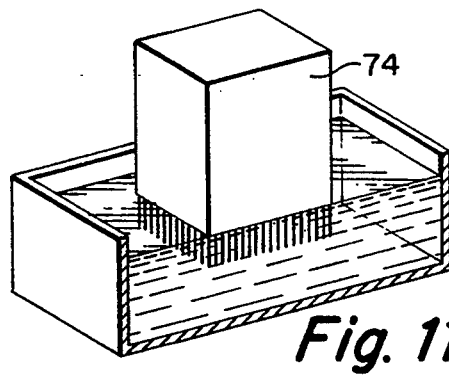
FIG. 11b illustrates a heating step for removing a portion of the removable material.
Figure 11C:
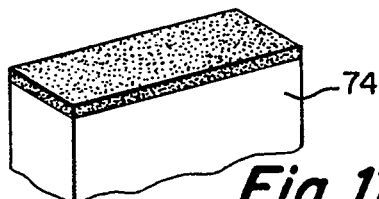
FIG. 11c illustrates a subsequent step of bonding the spaced fins.

FIG. 11b illustrates a block of fins 74 encased in a removable material, wherein one end of the block of fibers 74 is subjected to a heating or etching step, such as by dipping in a hot bath, for removing a portion of the removable material. The exposed fins from block 74 are then bonded with an adhesive to form a plate 75 as shown in FIG. 11c.

Figure 11D:
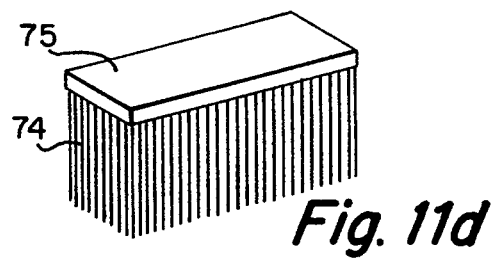
FIG. 11d depicts a second heating step for removing the remainder of the removable material.
Figure 11E:
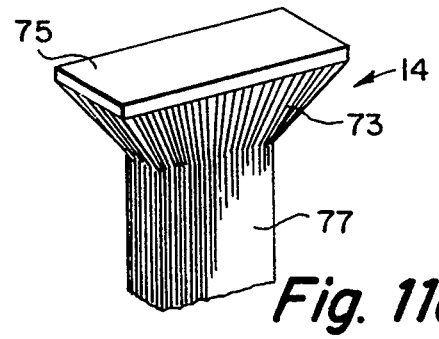
FIG. 11e shows the heat distributor at the completion of finishing steps.

FIG. 11d depicts the block of fins 74 following a second heating or etching step that removes the remainder of the removable material. Like the first heating step, the second removal step may also be accomplished by dipping the fin block 74 into a hot bath. The loose fins are drawn over a splay region 73 to a bundle 77 at a distance from plate 75, and further compressed, shaped, trimmed and insulated to provide the heat sink 14 illustrated in FIG. 11e.

Figure 12A:
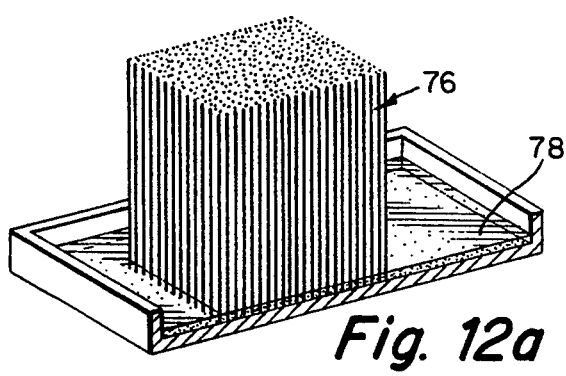
FIG. 12a illustrates a step in still another method of manufacturing the heat sink of the invention, wherein a bundle of fins are dipped into an elastomer.
Figure 12B:
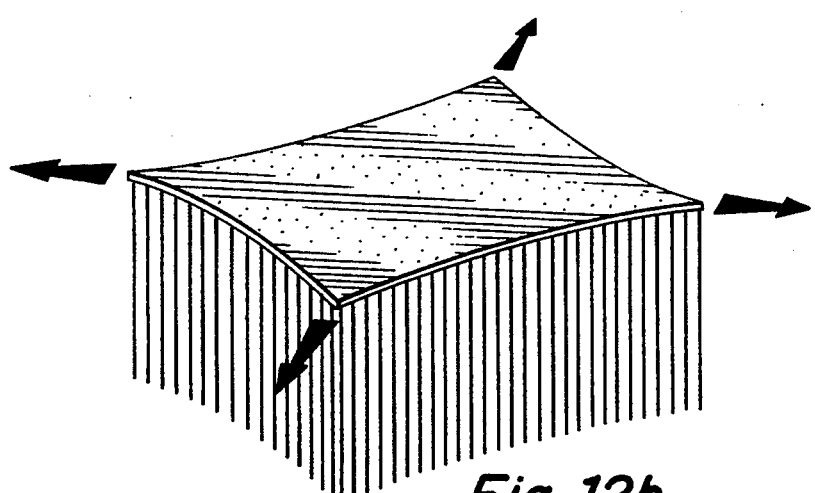
FIG. 12b illustrates a subsequent step wherein the elastomer is stretched to separate the fins.

FIG. 12a illustrates a step in still another method of manufacturing the heat sink 14, wherein one end of a bundle 76 of fins are dipped into a molten bath of a hyperelastic material 78. The hyperelastic material is allowed to cool into a thin film at the dipped end, after which it is stretched to separate the fins as shown in FIG. 12b.

Heretofore, the description has emphasized embodiments of heat sinks having fins with circular or oval cross-sections, and various manufacturing methods associated therewith. However, as previously indicated, the fins can also be flat or ribbon like. Embodiments of the heat sink using graphite fibers in ribbon like fin form permit additional configurations and manufacturing techniques than those described hereinabove.

Figure 13A:
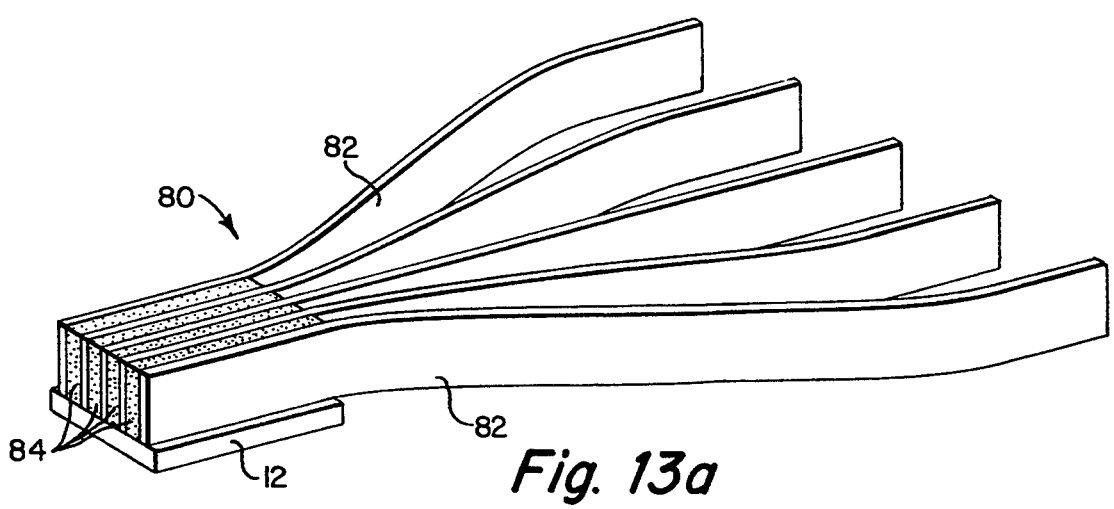
FIG. 13a is a perspective view of yet another embodiment of the heat sink of the invention having flattened fins.
Figure 13B:
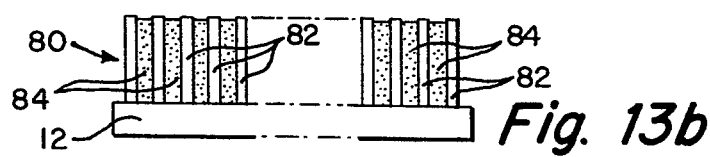
FIG. 13b is an end view of the heat sink of FIG. 13a that emphasizes layers of metallic film between the fibers.

FIG. 13a is a perspective view of a heat sink 80 having flattened graphite fiber fins 82 in edgewise contact with a surface, such as chip 12, to be cooled. In the illustrated embodiment, each of the fins is 0.3 inches wide and 0.004 inches thick, however these dimensions are variable depending upon a particular application. Although the fins 82 are outstanding thermal conductors along their longitudinal axis, they conduct heat relatively poorly between their constituent fibers along the lateral or transverse axis of the fin. Thus, when the heat sink 80 is configured as illustrated in FIG. 13a, a supplemental thermal conductor 84 is typically placed between one or more contiguous fins to draw heat laterally across the fibers to expose more surface area of the fiber to the heat source, thereby enhancing the performance of the heat sink 80. The supplemental thermal conductor 84 can be a metallic film, graphite fibers longitudinally aligned with the heat source, or any other suitable thermally conductive material. The interleaved configuration of the fins 82 and supplemental thermal conductor 84 is illustrated in greater detail in FIG. 13b which is an end view of the heat sink 80 positioned on a chip 12. Additionally, the flexibility of the fiber bundle can be improved by making longitudinal slits in the sides of the fiber bundle that pass completely through the bundle from one side to the other, excluding the portion of the bundle which is juxtaposed to the chip surface.

Figure 14A:
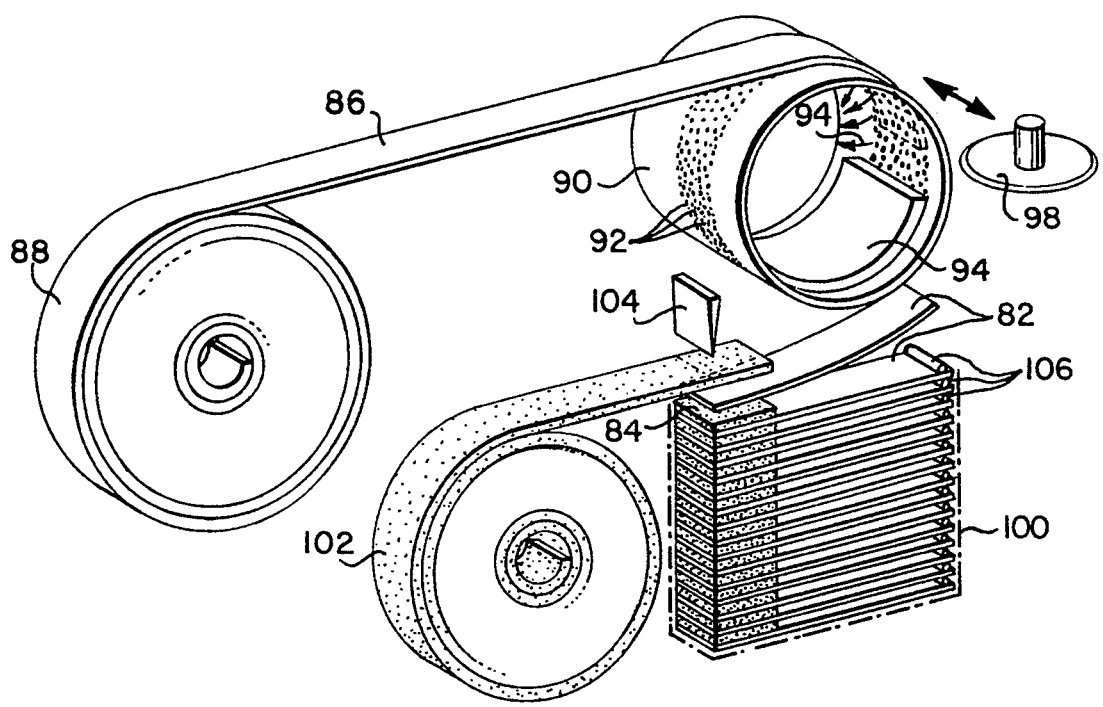

Owing to the flat nature of the fins 82 and the supplemental thermal conductor 84, the heat sink 80 lends itself to layering by stacking manufacturing techniques. One such technique is illustrated in FIG. 14a, which is a simplified diagram of an assembly line. A first station provides a supply of graphite ribbon material 86 that is unwound from a feed bobbin 88 and onto a rotating drum 90 that uses vacuum pressure to adhere the ribbon material 86 to an exterior surface of the drum 90. In one embodiment, air is aspirated into the drum 90 through numerous small holes 92 in one portion of the surface of the drum as shown by the arrows 94. At the bottom of the drum 90, a block 96 interferes with the vacuum suction sufficiently to allow the ribbon material 86 to separate from the drum 90, at which point a cutting tool 98 severs a predetermined length of ribbon 82 from the supply of ribbon material 86. To facilitate shaping the heat sink, the ribbons 82 drop into an appropriately dimensioned bin. As each ribbon 82 enters the bin 100, a supplemental thermal conductor 84, unwound from a supply bobbin 102 and trimmed to the appropriate length by a cutter 104, is placed thereupon. Concurrent with the insertion of each piece of supplemental thermal conductor 84 into the bin 100 is the insertion of spacing pins 106. The location of the pins 106 determines the dimensions of the heat distributor end of the heat sink, and more particularity the spacing between the fins.

Figure 14B:
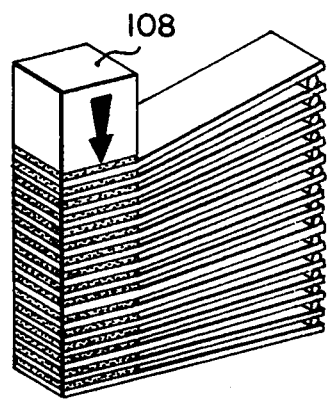

When the bin 100 is filled to a predetermined level, a ram 108 compresses the end of the fibers interleaved with supplemental thermal conductor, as illustrated in FIG. 14b, to eliminate undesirable insulating air pockets and to properly dimension the end which is either glued or bolted together. The central portion of the bundle of fibers can then be wrapped and additional structures secured to the pins to maintain the integrity of the heat distributor. Alternatively, the pins may be removed after the spacing between the fins is stabilized by other means as described hereinabove.

Numerous modifications and variations of the present invention are possible in light of the above teachings. It is, therefore, to be understood that within the scope of the appended claims, the present invention may be practiced otherwise than as in the embodiments specifically described hereinabove.

What is claimed is:

1. A heat sink, comprising:
   a fiber bundle expanded in a cooling region into a plurality of separate fins of one or more fibers each;
   said fiber bundle including a plurality of thermally conductive fibers extending from a first fiber bundle end to a second expanded fiber bundle end forming said plurality of fins;

the fins at said second expanded fiber bundle end being spaced apart from adjacent ones of said fins in a splayed pattern; and means for maintaining said plurality of fins in said splayed pattern, said means for maintaining being independent of said fins.

2. The heat sink of claim 1, wherein said fibers are graphite.

3. The heat sink of claim 1, wherein said fibers are aluminum.

4. The heat sink of claim 1, wherein said fibers are copper.

5. The heat sink of claim 1, wherein a portion of said first fiber bundle end is metal impregnated.

6. The heat sink of claim 5, wherein said metal includes aluminum.

7. The heat sink of claim 5, wherein said metal includes copper.

8. The heat sink of claim 1, wherein said fins have a circular cross-section.

9. The heat sink of claim 1, wherein said fins have an oval cross-section.

10. The heat sink of claim 1, wherein said fins have a rectangular cross-section.

11. The heat sink of claim 1, wherein said fins are flat.

12. The heat sink of claim 1, wherein a portion of said fiber bundle is compressed sufficiently to minimize air within said fiber bundle.

13. A heat sink, comprising:
a fiber bundle expanded in a cooling region into a plurality of separate fins of one or more fibers each and having a heat dissipation surface area in said cooling region that includes the total area of all fins;
said fiber bundle including a plurality of thermally conductive fibers extending from a first fiber bundle end to a second expanded fiber bundle end forming said plurality of fins;
the fins at said second expanded fiber bundle end being spaced apart from adjacent ones of said fins in a splayed pattern that freely admits a flow of an environmental fluid therebetween in said cooling region;
the fins thus splayed in the cooling region having a vast heat dissipation surface area; and
each said fin being parallel to an adjacent fin proximate said first fiber bundle end.

14. A heat sink, comprising:
a fiber bundle expanded in a cooling region into a plurality of separate fins of one or more fibers each and having a heat dissipation surface area in said cooling region that includes the total area of all fins;
said fiber bundle including a plurality of thermally conductive fibers extending from a first fiber bundle end to a second expanded fiber bundle end forming said plurality of fins;
the fins at said second expanded fiber bundle end being spaced apart from adjacent ones of said fins in a splayed pattern that freely admits a flow of an environmental fluid therebetween in said cooling region;
the fins thus splayed in the cooling region having a vast heat dissipation surface area; and at least a portion of each said fiber proximate said first fiber bundle end separated from an adjacent fiber by a supplemental thermal conductor.

15. The heat sink of claim 14, wherein said supplemental thermal conductor is a metallic film.

16. The heat sink of claim 15, wherein said metallic film includes copper.

17. The heat sink of claim 14, wherein said supplemental thermal conductor includes a plurality of graphite fibers.

18. A heat sink, comprising:
a fiber bundle expanded in a cooling region into a plurality of separate fins of one or more fibers each and having a heat dissipation surface area in said cooling region that includes the total area of all fins;
said fiber bundle including a plurality of thermally conductive fibers extending from a first fiber bundle end to a second expanded fiber bundle end forming said plurality of fins;
the fins at said second expanded fiber bundle end being spaced apart from adjacent ones of said fins in a splayed pattern that freely admits a flow of an environmental fluid therebetween in said cooling region;
the fins thus splayed in the cooling region having a vast heat dissipation surface area; and
said fiber bundle being provided with an insulating layer.

19. A heat sink, comprising:
a fiber bundle expanded in a cooling region into a plurality of separate fins of one or more fibers each and having a heat dissipation surface area in said cooling region that includes the total area of all fins;
said fiber bundle including a plurality of thermally conductive fibers extending from a first fiber bundle end to a second expanded fiber bundle end forming said plurality of fins;
the fins at said second expanded fiber bundle end being spaced apart from adjacent ones of said fins in a splayed pattern that freely admits a flow of an environmental fluid therebetween in said cooling region;
the fins thus splayed in the cooling region having a vast heat dissipation surface area;
means for retaining each fin in spaced apart relation from an adjacent fin; and
said means for retaining including a plurality of strips separating said plurality of fins into layers.

20. The heat sink of claim 19, wherein each of said plurality of strips includes a plurality of depressions, each said depression positioning a single fin therein.

21. A heat sink, comprising:
a fiber bundle expanded in a cooling region into a plurality of separate fins of one or more fibers each and having a heat dissipation surface area in said cooling region that includes the total area of all fins;
said fiber bundle including a plurality of thermally conductive fibers extending from a first fiber bundle end to a second expanded fiber bundle end forming said plurality of fins;
the fins at said second expanded fiber bundle end being spaced apart from adjacent ones of said fins in a splayed pattern that freely admits a flow of an environmental fluid therebetween in said cooling region;

the fins thus splayed in the cooling region having a vast heat dissipation surface area;

means for retaining each fin in spaced apart relation from an adjacent fin; and said means for retaining including an adhesive.

22. A heat sink, comprising:

a fiber bundle expanded in a cooling region into a plurality of separate fins of one or more fibers each and having a heat dissipation surface area in said cooling region that includes the total area of all fins;

said fiber bundle including a plurality of thermally conductive fibers extending from a first fiber bundle end to a second expanded fiber bundle end forming said plurality of fins;

the fins at said second expanded fiber bundle end being spaced apart from adjacent ones of said fins in a splayed pattern that freely admits a flow of an environmental fluid therebetween in said cooling region;

the fins thus splayed in the cooling region having a vast heat dissipation surface area;

means for retaining each fin in spaced apart relation from an adjacent fin; and said means for retaining including an elastomer.

23. A heat sink, comprising:

a fiber bundle expanded in a cooling region into a plurality of separate fins of one or more fibers each and having a heat dissipation surface area in said cooling region that includes the total area of all fins;

said fiber bundle including a plurality of thermally conductive fibers extending from a first fiber bundle end to a second expanded fiber bundle end forming said plurality of fins;

the fins at said second expanded fiber bundle end being spaced apart from adjacent ones of said fins in a splayed pattern that freely admits a flow of an environmental fluid therebetween in said cooling region;

the fins thus splayed in the cooling region having a vast heat dissipation surface area;

means for retaining each fin in spaced apart relation from an adjacent fin; and said means for retaining includes a plurality of pins.

* * * * *

UNITED STATES PATENT AND TRADEMARK OFFICE
CERTIFICATE OF CORRECTION

PATENT NO. : 5,390,734
DATED : Feb. 21, 1995
INVENTOR(S) : David W. Voorhes, et al.

It is certified that error appears in the above-indentified patent and that said Letters Patent is hereby corrected as shown below:

Column 7, line 24, "$\eta$ = cooling fluid viscosity" should read --$\mu$ = cooling fluid viscosity--.

Signed and Sealed this

Twelfth Day of September, 1995

Attest:

BRUCE LEHMAN

*Attesting Officer*      *Commissioner of Patents and Trademarks*